(12) United States Patent
Luo

(10) Patent No.: US 7,262,666 B2
(45) Date of Patent: *Aug. 28, 2007

(54) AMPLIFIER CIRCUIT HAVING AN EXTENDED WILSON CURRENT-MIRROR SELF-BIAS BOOSTING CIRCUIT

(75) Inventor: Sifen Luo, Potomac, MD (US)

(73) Assignee: NXP B.V., Eindhoven (NL)

( * ) Notice: Subject to any disclaimer, the term of this patent is extended or adjusted under 35 U.S.C. 154(b) by 205 days.

This patent is subject to a terminal disclaimer.

(21) Appl. No.: 10/537,592

(22) PCT Filed: Nov. 25, 2003

(86) PCT No.: PCT/IB03/05395

§ 371 (c)(1),
(2), (4) Date: Jun. 6, 2005

(87) PCT Pub. No.: WO2004/054094

PCT Pub. Date: Jun. 24, 2004

(65) Prior Publication Data

US 2006/0158256 A1    Jul. 20, 2006

Related U.S. Application Data

(60) Provisional application No. 60/431,842, filed on Dec. 9, 2002.

(51) Int. Cl.
*H03F 3/04* (2006.01)

(52) U.S. Cl. ............................................. 330/296
(58) Field of Classification Search ............... 330/288, 330/296
See application file for complete search history.

(56) References Cited

U.S. PATENT DOCUMENTS

| 5,548,248 | A | 8/1996 | Wang | |
|---|---|---|---|---|
| 5,844,443 | A | 12/1998 | Wong | |
| 6,064,268 | A | * 5/2000 | Felps | 330/288 |
| 6,300,837 | B1 | 10/2001 | Sowlati | |
| 6,358,516 | B1 | 3/2002 | Harod | |
| 6,414,553 | B1 | 7/2002 | Luo | |
| 6,486,739 | B1 | * 11/2002 | Luo | 330/288 |
| 6,492,875 | B2 | 12/2002 | Luo | |

* cited by examiner

*Primary Examiner*—Steven J. Mottola
(74) *Attorney, Agent, or Firm*—Peter Zawilski

(57) ABSTRACT

An amplifier circuit (1) includes an amplifying transistor (QØ) and a dc bias circuit (2) for biasing the amplifier transistor (QØ) to obtain a conduction angle of at least about 180°. The dc bias circuit (2) includes a self-bias boosting circuit which has a Wilson current-mirror (Q4, Q5, Q6) integrated with a cascode current-mirror circuit (Q2, Q3) to form an extended Wilson current-mirror circuit (Q2-Q6) having an output coupled to a control terminal of the amplifying transistor (QØ) by a resistor (R1), and a capacitor (C2) coupled from the extended Wilson current-mirror circuit (Q2-Q6) to a common terminal (Gnd).

6 Claims, 1 Drawing Sheet

Figure 1:
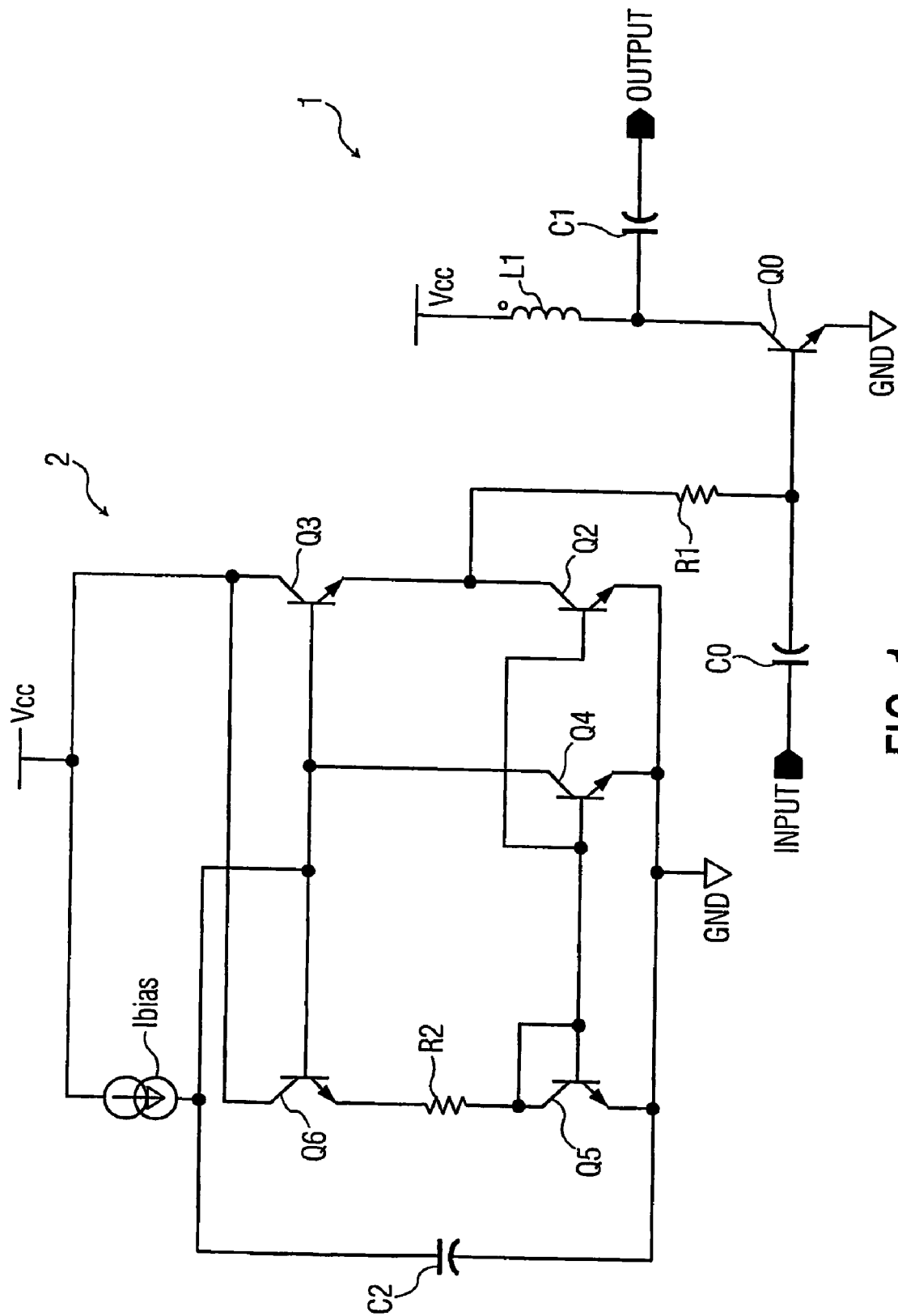

AMPLIFIER CIRCUIT HAVING AN EXTENDED WILSON CURRENT-MIRROR SELF-BIAS BOOSTING CIRCUIT

CROSS REFERENCE TO RELATED APPLICATION

This application claims the benefit of U.S. provisional application Ser. No. 60/431,842 filed Dec. 9, 2002, which is incorporated herein by reference.

The invention is in the field of transistor amplifier circuits, and relates more particularly to a power amplifier circuit having an extended Wilson current-mirror self-bias boosting circuit.

Amplifiers of this general type are frequently used in high-frequency RF amplifiers, such as for telecommunications applications, as well as in audio amplifiers and other applications. In order to obtain a linear input-output relationship and high operating efficiency, such amplifiers are typically operated with a conduction angle of about 180° Cancel(Class B) or slightly greater (Class AB) to avoid crossover distortion.

Typically, amplifiers of this type require a dc bias circuit to establish the quiescent bias current in the amplifier circuit to ensure operation in the Class B or Class AB mode. In the prior art, bias is typically provided by a fixed current source, as shown in U.S. Pat. No. 5,844,443, or else by an external supply, which can be set to a desired constant value to secure the quiescent current necessary to operate in the desired mode, as shown in U.S. Pat. No. 5,548,248.

However, in amplifiers of the type described above the average current drawn from the supply depends upon the input signal level. As the output power increases so does the average current in both the emitter and the base of the power transistor. This increased average current causes an increased voltage drop in the biasing circuitry and in ballast resistors (which are used to avoid hot-spotting and thermal runaway in transistors using an interdigitated design). This in turn reduces the conduction angle (i.e. the number of degrees out of 360° that the amplifier is conducting), and forces the amplifier deep into Class B or even Class C operation, thereby reducing the maximum power output. To avoid this power reduction, the amplifier must have a larger quiescent bias. In prior-art circuitry this inevitably leads to a higher power dissipation at low power output levels and therefore an undesirable tradeoff in operating characteristics.

A recent improvement in this art is disclosed in commonly-assigned U.S. Pat. No. 6,300,837, entitled Dynamic Bias Boosting Circuit For A Power Amplifier. This patent discloses a solution to the problem discussed above which entails providing the power amplifier circuit with a dynamic bias boosting circuit to dynamically increase the bias of the power transistor as the output power increases by using a circuit that senses the input voltage to the amplifier and generates a dynamic bias boost as a function of the amplitude of this signal. The drawback to this solution is that it employs numerous active and passive components, thus not maximizing simplicity, compactness and economy of manufacture.

Another recent improvement in this area is disclosed in co-pending and commonly-assigned allowed U.S. patent application Ser. No. 09/730,657, entitled Self-Boosting Circuit For A Power Amplifier, filed on Dec. 6, 2000. This application presents an improved self-bias boosting circuit having an RC coupling network between the DC bias circuit and the amplifying transistor while using a generic DC bias circuit A similar RC coupling network in conjunction with a cascode current-mirror bias boosting circuit is shown in commonly-assigned U.S. Pat. No. 6,414,553.

A scheme for independently controlling quiescent current and bias impedance is disclosed in High-Frequency Amplifier Circuit With Independent Control Of Quiescent Current And Bias Impedance, commonly-assigned U.S. Pat. No. 6,358,516. Although this scheme is capable of achieving high power-added efficiency while maintaining linearity, it employs a rather complex circuit and contributes a significant level of noise to the output stage.

All of the foregoing references are hereby incorporated by reference in their entirety.

Accordingly, it would be desirable to have a power amplifier circuit which offers the advantages of optimum maximum output power and gain while keeping the idle current of the amplifying stage relatively low. Additionally, the circuit should be able to establish the amount of self-bias boosting so that the power transistor can be properly biased for high power output and linearity as the power output increases, without the use of a boosting capacitor, while controlling the quiescent current in the power transistor. Finally, it would be desirable for such a circuit to be simple and compact in design, and economical to manufacture.

It is therefore an object of the present invention to provide an amplifier circuit which provides improved maximum output power and gain while keeping the idle current of the amplifying stage relatively low. It is a further object of the invention to provide a circuit which is able to establish the amount of self-bias boosting so that the amplifying transistor can be properly biased for high power output and linearity as the power output increases, while controlling the idle current in the amplifying transistor. Yet a further object of the invention to provide a circuit which is both simple and compact in design and which is economical to manufacture.

In accordance with the invention, these objects are achieved by a new amplifier circuit for amplifying an input signal and having a conduction angle of at least about 180°, the amplifier circuit including an amplifying transistor and a dc bias circuit for biasing the amplifier transistor to obtain the desired conduction angle. The dc bias circuit includes a self-bias boosting circuit which has a Wilson current-mirror integrated with a cascode current-mirror circuit to form an extended Wilson current mirror circuit having an output coupled to a control terminal of the amplifying transistor by a resistor, and a capacitor coupled from the cascode current-mirror circuit to a common terminal.

In a preferred embodiment of the invention, the cascode current-mirror circuit includes a first pair of transistors having main current paths connected in series, with the output of the current-mirror circuit being taken from a common point of this series connection, and a second pair of transistors having main current paths connected in series, with a bias current source being coupled from a power supply terminal of the amplifier to the extended Wilson current mirror.

An amplifier circuit in accordance with the present invention offers a significant improvement in that a particularly advantageous combination of features, including increased maximum output power and gain, selectable self-bias boosting level, controllable quiescent current and reduced idle current, can be obtained in a simple, compact and economical configuration.

These and other aspects of the invention will be apparent from and elucidated with reference to the embodiments described hereinafter.

The invention may be more completely understood with reference to the following description, to be read in conjunction with the accompanying drawing, in which the single FIGURE shows a simplified schematic diagram of a power amplifier circuit in accordance with a preferred embodiment of the invention.

A simplified schematic diagram of an amplifier circuit 1 is shown in the single FIGURE of the drawing. The amplifier circuit includes an amplifying transistor QØ and a dc bias circuit 2 coupled to the base of the amplifying transistor QØ by a resistor R1. The bias circuit 2 includes bipolar transistors Q2 and Q3, coupled in series between $V_{cc}$ and a common terminal (Gnd), with the common point of the transistors being coupled to the base of transistor QØ by resistor R1. The basic circuit configuration is completed by an input coupling capacitor C0 for coupling an Input to the base of amplifying transistor QØ, with the transistor QØ being connected in a common-emitter configuration and coupled between $V_{cc}$ and Gnd by an inductor L1. The Output of power amplifier circuit 1 is taken from the collector of transistor QØ through a capacitor C1.

In connection with the circuit shown, it should be understood that although the active components are shown as bipolar transistors for illustrative purposes, field effect transistors or a combination of bipolar and field effect transistors may alternatively be used within the scope of the invention. Additionally, it is to be understood that the power amplifier circuit 1 and bias circuit 2 may differ in form and detail from the simplified, illustrative depictions shown in the drawing. Furthermore, it is to be understood that the bias supply may be configured and adjusted to permit the amplifier circuit to operate in either Class B or Class AB mode.

The bias circuit 2 comprises a Wilson current-mirror including transistors Q4, Q5 and Q6, current source Ibias, and resistor R2, integrated with a cascode current mirror including transistors Q2 and Q3, and capacitor C2 which is a bypass capacitor. Transistors Q2-Q6 form an extended Wilson current-mirror. The collector node of QØ is the output node and is connected to a supply voltage through an external pull-up inductor L1. An Input is applied to the base of QØ through an AC coupling capacitor CØ that can be part of a matching circuit to a drive stage.

The current source Ibias in the bias circuit controls both the output drive current of the bias stage and the quiescent current of the amplifying transistor. The mechanism by which Ibias controls the output drive current is straightforward because the bias circuit is a cascode current mirror circuit. The mechanism for controlling the quiescent current of QØ can be explained as follows. Assume that all transistors in the circuits are identical and perfectly matched. Kirchoff's Law dictates that DC voltage Vbe(QØ)+V(R1)+Vbe(Q3) must be equal to Vbe(Q2)+V(R2)+Vbe(Q6). As Vbe(Q3) is approximately equal to Vbe(Q2), Vbe(QØ) is therefore approximately equal to Vbe(Q6) when V(R1) is set equal to V(R2) by properly choosing the resistance values. Therefore Ibias dictates the quiescent current in QØ as well as the drive currents in Q2 and Q3.

By properly scaling the emitter area ratios between transistor pairs, the quiescent current in QØ and drive currents in Q2 and Q3 can be made directly proportional to the value of Ibias. In the example given here, the ratios of 64 to 1 (QØ to Q6) and 8 to 1 (Q2 and Q4 to Q5, and Q3 to Q6) can be used.

The mechanism of the self-bias boosting of the bias circuit shown in the Figure can be explained as follows. Q3 charges QØ and Q2 discharges QØ through the resistor R1. The discharging rate of Q2 is much faster than or equal to the charging rate of Q3 when the input power is low. As the input power increases, the discharging rate of Q2 becomes slower than the charging rate of Q3. Therefore the average voltage across the forward-biased PN junction of QØ increases.

In the foregoing manner, the present invention provides an amplifier circuit with a self-bias boosting circuit which provides improved maximum output power and gain while keeping the idle current of the amplifying stage relatively low. In addition, the amplifier circuit is able to set the amount of self-bias boosting so that the amplifying transistor can be properly biased for high power output and linearity as the power output increases, while controlling the idle current in the amplifying transistor. The circuit is both simple and compact in design, and is economical to manufacture.

While the invention has been particularly shown and described with reference to a preferred embodiment thereof, it will be understood by those skilled in the art that various changes in form and detail, some of which have been suggested above, may be made without departing from the spirit or scope of the invention. Thus, for example, different types of transistors may be employed, and alterations to the circuit configuration may be made to suit particular design requirement.

The invention claimed is:

1. An amplifier circuit for amplifying an input signal and having a conduction angle of at least about 180°, said amplifier circuit comprising an amplifying transistor and a dc bias circuit for biasing said amplifying transistor to obtain said conduction angle, said dc bias circuit having a self-bias boosting circuit comprising a Wilson current-mirror integrated with a cascode current-mirror circuit to form an extended Wilson current-mirror circuit having an output coupled to a control terminal of said amplifying transistor by a resistor, and a capacitor coupled from said extended Wilson current-mirror circuit to a common terminal.

2. An amplifier circuit as in claim 1, wherein said amplifier circuit is a Class AB amplifier circuit.

3. An amplifier circuit as in claim 1, wherein said cascode current-mirror circuit comprises a first pair of transistors having main current paths connected in series, said output being taken from a common point of said series connection, and a second pair of transistors having main current paths connected in series, with a bias current source being coupled from a power supply terminal of the amplifier to a control electrode of a first transistor of said first pair of transistors and to a control electrode of a first transistor of said second pair of transistors.

4. An amplifier circuit as claimed in claim 3, further comprising a resistor coupled in series with and between said second pair of transistors.

5. An amplifier circuit as in claim 4, wherein a second transistor of said first pair and a second transistor of said second pair each have a main current path connected to said common terminal.

6. An amplifier circuit as in claim 5, further comprising a further transistor forming a part of said Wilson current mirror circuit and having a control electrode coupled to a control electrode of said second transistor of said first pair and a control electrode of said second transistor of said second pair, and having a main current path coupled between said common terminal and a control electrode of both said first transistor of said first pair and said first transistor of said second pair at a first junction.

* * * * *